US006812092B2

(12) United States Patent
Seitz et al.

(10) Patent No.: US 6,812,092 B2
(45) Date of Patent: Nov. 2, 2004

(54) METHOD FOR FABRICATING TRANSISTORS HAVING DAMASCENE FORMED GATE CONTACTS AND SELF-ALIGNED BORDERLESS BIT LINE CONTACTS

(75) Inventors: Mihel Seitz, Radebeul (DE); Michael Wise, Lagrangeville, NY (US); Christian Dubuc, St-Hyacinthe (CA)

(73) Assignee: Infineon Technologies, Munich (DE)

( * ) Notice: Subject to any disclaimer, the term of this patent is extended or adjusted under 35 U.S.C. 154(b) by 0 days.

(21) Appl. No.: 09/740,113

(22) Filed: Dec. 19, 2000

(65) Prior Publication Data

US 2004/0033659 A1 Feb. 19, 2004

(51) Int. Cl.⁷ .......................................... H01L 21/8242
(52) U.S. Cl. ...................... 438/243; 438/197; 438/239; 438/268; 438/279
(58) Field of Search ................................ 438/197, 238, 438/239, 243, 268, 270, 272, 275, 279

(56) References Cited

U.S. PATENT DOCUMENTS

| 5,384,277 A | | 1/1995 | Hsu et al. | |
|---|---|---|---|---|
| 5,886,411 A | | 3/1999 | Kohyama | |
| 6,037,194 A | * | 3/2000 | Bronner et al. | ............ 438/147 |
| 6,144,054 A | | 11/2000 | Agahi et al. | |
| 6,153,902 A | | 11/2000 | Furukawa et al. | |
| 6,175,128 B1 | | 1/2001 | Hakey et al. | |
| 6,288,422 B1 | * | 9/2001 | Mandelman et al. | ....... 257/301 |
| 6,297,088 B1 | * | 10/2001 | King | ........................ 438/243 |
| 6,312,982 B1 | * | 11/2001 | Takato et al. | ............... 438/238 |
| 6,391,705 B1 | * | 5/2002 | Hsiao et al. | ................ 438/243 |
| 6,555,862 B1 | * | 4/2003 | Mandelman et al. | ....... 257/301 |
| 6,744,104 B1 | * | 6/2004 | Aoki et al. | ................. 257/372 |

FOREIGN PATENT DOCUMENTS

JP          63284851         11/1988

* cited by examiner

Primary Examiner—David A. Zarneke
Assistant Examiner—Thanh Y. Tran
(74) Attorney, Agent, or Firm—Slater & Matsil, L.L.P.

(57) ABSTRACT

A Dynamic Random Access Memory is fabricated in a semiconductor body of a first conductivity type in which there have been formed an array of memory cells which each include a trench capacitor and a vertical Insulated Gate Field Effect Transistor (IGFET). Each IGFET includes first and second output regions of a second opposite conductivity type and a gate which is separated from a surface of the semiconductor body by a gate dielectric layer. A gate electrode connected to the gate is formed using a Damascene process with insulating sidewall spacer regions being formed before the gate electrode is formed. Borderless contacts, which are self aligned, are made to the first output regions of each transistor using a Damascene process.

18 Claims, 16 Drawing Sheets

US 6,812,092 B2

METHOD FOR FABRICATING TRANSISTORS HAVING DAMASCENE FORMED GATE CONTACTS AND SELF-ALIGNED BORDERLESS BIT LINE CONTACTS

FIELD OF THE INVENTION

This invention relates to integrated circuits, and more particularly, to Dynamic Random Access Memory (DRAM) and Insulated Gate Field Effect Transistors (IGFETs) in which vertical transistors are used with gate connections formed by a Damascene process and bit line region contacts which are self-aligned and borderless to adjacent gates. An IGFET may also be denoted as a Metal-Oxide-Semiconductor (MOS) transistor.

BACKGROUND OF THE INVENTION

Many chip fabricators (fabs) use planar structures to form DRAMS with polysilicon (poly) and tungsten silicide ($WSi_x$) for gate conductors. As ground rules become tighter (e.g., =0.13 μm) it is increasingly more difficult to maintain feature sizes of 1F using these processes and to provide void free insulation between gates of transistors. In general Critical Dimension (CD) tolerances shrink less aggressively than ground rules and therefore even small changes within process tolerances can result in product failure. Conventional sidewall gate insulation layers are typically formed after the formation of a gate electrode of a transistor. The aspect ratio of the opening through which these conventional sidewall spacers are formed is typically relatively high. This can result in formation of elongated voids in the insulation material between the gates.

If Boron Phosphosilicate Glass (BPSG) is used as one of the isolation materials, voids can be formed along the wordline which can inadvertently be filled with a conductive material which could lead to an undesirable short connection. Even relatively short etching times for precleaning the substrate surface prior to the Bitline contact fill with conductive material may result in the formation of pathways to the adjacent contact conductor producing electrical short circuits in the arrays.

Planar Gate transistor technology relies on the deposition of conducting materials which are patterned using photolithographic methods. After the conductor layers are patterned, it is necessary to isolate them from each other. For high aspect ratio films and aggressive ground rules in which critical dimension tolerances do not scale as fast as ground rules, it is becoming increasingly more difficult to fill the gaps with an insulating material with a low thermal budget. For example, if the gap is 150 nm and the layer thickness is 1100 nm, the aspect ratio of the feature to fill becomes larger than seven. It is not uncommon during the deposition of the gap fill material to have the gap fill first above the base which precludes achieving a complete gap fill and leaves the unfilled portion of the gap without isolation. Critical dimension control of the conducting material becomes less stringent when vertical field effect transistors are used in the memory cells of the DRAM. Thus a Damascene process can be used without any substantial loss in yield.

In the vertical DRAM cell the effective gate length can be decoupled from the lateral photographic dimensions. The stringent leakage requirements of the DRAM cell are limited by the scaling methods now in use. A cascade of problems arise as the gate poly length is reduced. For example, a reduction in gate poly length requires thinner gate oxides and increased channel doping to prevent short channel effects. When the doping levels are increased, the junction leakage can effect the data retention time.

It is desirable to be able to fabricate memory cells that include vertical insulated gate field effect transistors and trench capacitors and to be able to obtain high density at high yields and to fill contact openings which have large aspect ratios while achieving acceptable yields.

SUMMARY OF THE INVENTION

In a first aspect the invention is a method of forming in a semiconductor body of a first conductivity type in which there has been formed an array of memory cells which each comprise an insulated gate field effect transistor, which comprises first and second output regions of a second opposite conductivity type and a gate which is separated from the semiconductor body by a gate dielectric layer, contacts to the gates and first output regions. The method comprises the steps of: forming first insulating regions around portions of a top surface of the semiconductor body in which gate contacts are to be formed; forming gate contacts using a Damascene process in the portions of the semiconductor body surrounded by the first insulating regions; forming second insulating regions around exposed portions of the gate contacts; forming a borderless contact to each one of the first output regions of each transistor with the first and second insulating regions electrically isolating the gate contacts from the contacts to the first output regions.

In a second aspect the invention is a method of forming in a semiconductor body, which has a top surface and being of a first conductivity type, and in which there has been formed an array of memory cells which each comprise a vertical insulated gate field effect transistor having first and second output regions of a second opposite conductivity type and a gate which is separated from a vertical surface of the semiconductor body by a gate dielectric layer, contacts to the gates and the first output regions. The method comprises the steps of: forming vertical insulating regions around portions of the top surface of the semiconductor body in which gate contacts are to be formed; forming gate contacts using a Damascene process in the portions of the semiconductor body surrounded by the first insulating regions; forming horizontal insulating regions around exposed portions of the gate contacts; forming a borderless contact to each one of the first output regions of each transistor with the vertical and horizontal insulating regions electrically isolating the gate contacts from the contacts to the first output regions.

In a third aspect the invention is a method of forming in a semiconductor body, which has a top surface and is of a first conductivity type, and in which there have been formed an array of memory cells which each comprise a trench capacitor and a vertical insulated gate field effect transistor, which comprises first and second output regions of a second opposite conductivity type and a gate which is separated from a vertical surface of the semiconductor body by a gate dielectric layer, electrical contacts to the gates and first output regions. The method comprises the steps of: forming a first insulating layer over a top surface of the semiconductor body; forming first openings through the first insulating layer so as to expose a portion of the top surface of the semiconductor body in which the gates are located; forming insulating sidewall spacer regions on sidewalls of the openings through the first insulating layer with the insulating sidewall spacer regions being of a different material than the first insulating layer; over filling the first openings through the first insulating layer with a first conductor which contacts the gates of each transistor and extends over a top surface of the first insulating layer; removing portions of the first conductor on the top surface of the first insulating layer so as to result in a segmented first conductor filling each of the first openings; covering exposed surfaces of the first conductors with a second insulating layer which is of a material different than that of the first insulating layer; forming first openings through the second insulating layer and second openings through the first insulating layer between adjacent insulating sidewall spacer regions to expose portions of the semiconductor top surface which include portions of the first output regions; and filling each of the second openings through the first insulating layer with a second conductor which contacts a first output region such that each second conductor is self aligned and borderless.

In a fourth aspect the invention is a method of forming in a semiconductor body of a first conductivity type in which there have been formed an array of memory cells which each comprise a trench capacitor and a vertical insulated gate field effect transistor, which comprises first and second output regions of a second opposite conductivity type and a gate which is separated from a surface of the semiconductor body by a gate dielectric layer, electrical contacts to the gate and first output region. The method comprises the steps of: forming a first insulating layer over a top surface of the semiconductor body; forming separated first openings through the first insulating layer so as to expose a portion of the top surface of the semiconductor body in which the gates are located; forming insulating sidewall spacer regions on sidewalls of the openings through the first insulating layer with the insulating sidewall spacer regions being of a different material than the first insulating layer; over filling the first openings through the first insulating layer with a first conductor which contacts the gates of each transistor and extends over a top surface of the first insulating layer; removing portions of the first conductor on the top surface of the first insulating layer so as to result in a segmented first conductor filling each of the first openings; removing portions of the segmented first conductors so as to recess same in each of the first openings; over filling the first openings with a second insulating layer which is of a material different than that of the first insulating layer; removing portions of the second insulating layer so as to form a planar surface which includes portions of the first and second insulating layers; forming second openings through the first insulating layer between adjacent insulating sidewall spacers to expose portions of the semiconductor top surface which include portions of the first output regions; and filling each of the second openings through the first insulating layer with a second conductor which contacts a first output region such that each second conductor is self aligned and borderless.

In a fifth aspect the invention is a method of forming in a semiconductor body of a first conductivity type in which there have been formed an array of memory cells which each comprise a trench capacitor and a vertical insulated gate field effect transistor, which comprises first and second output regions of a second opposite conductivity type and a gate which is separated from a surface of the semiconductor body by a gate dielectric layer, electrical contacts to the gate and first output region. The method comprises the steps of: forming a first insulating layer over a top surface of the semiconductor body; forming separated first openings through the first insulating layer so as to expose a portion of the top surface of the semiconductor body in which the gates are located; forming insulating sidewall spacer regions on sidewalls of the openings through the first insulating layer with the insulating sidewall spacer regions being of a different material than the first insulating layer; over filling the first openings through the first insulating layer with a first conductor which contacts the gates of each transistor and extends over a top surface of the first insulating layer; removing portions of the first conductor on the top surface of the first insulating layer so as to result in a segmented first conductor filling each of the first openings; removing portions of the segmented first conductors so as to recess same in each of the first openings; over filling the first openings with a second conformal insulating layer which is of a material different than that of the first insulating layer; filling recesses in the second conformal insulating layer with a self planarizing third insulator layer so as to form a planar surface common to the second conformal insulating layer and the self planarizing insulator layer, the self planarizing insulator layer being of a different material than the first insulating layer; removing portions of the second conformal insulating layer not covered by the self planarizing third insulating layer; removing the self planarizing third insulator layer; forming a fourth insulating layer over the resulting structure; removing all portions of the fourth insulating layer except those portions which are over the remaining portions of the second insulating layer and remaining portions of the first insulator layer to create separated first openings through the fourth insulator layer and second openings through the first insulator layer to expose portions of the top surface of the semiconductor body in which are located the first output regions, the first openings through the fourth insulating layer and the second openings through the first insulating layer being aligned; filling each of the first openings through the fourth insulating layer and the second openings through the first insulating layer with a second conductor which contacts a first output region such that each second conductor is self aligned and borderless.

The invention will be better understood from the following more detailed description taken in conjunction with the accompanying drawings and claims.

The drawings are not necessarily to scale.

DETAILED DESCRIPTION

Figure 1:
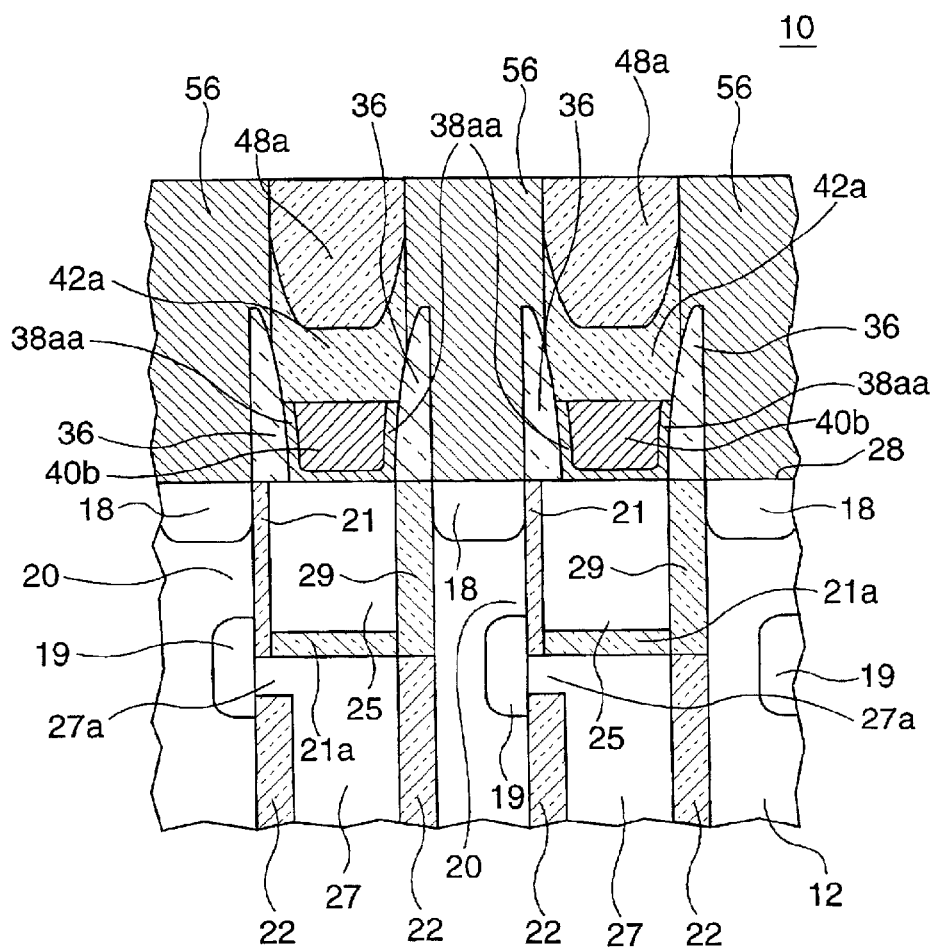
FIG. 1 shows a cross-sectional view of a first semiconductor structure in accordance with a preferred embodiment of the present invention.

FIG. 1 shows an a cross-sectional view of a semiconductor structure 10 which comprises a plurality of memory cells of a dynamic random access memory (DRAM) formed in and on a semiconductor body (substrate) 12 in accordance with a preferred embodiment of the present invention. Each memory cell comprises a vertical insulated gate field effect transistor (IGFET) and a trench type capacitor of which only a portion is shown. The semiconductor body 12 is of a first conductivity type, e.g., p-type, and has a top surface 28. Each memory cell comprises a first output region 18 and a second output region 19 which are both of a second conductivity type, e.g., n-type, which is opposite the first conductivity type. The first output region 18 may be denoted a drain region and the second output region 19 may be denoted a source region. The drain and source designations for the first and second output regions reverses during read and write operations of a memory cell. Separate contacts (drain region electrodes) 56 contact each drain region 18. The source and drain regions 18 and 19 are separated by a portion 20 of the semiconductor body 12 which is denoted the channel region of the transistor. The first output region 18 extends from the top surface 28 into a bulk portion of the semiconductor body 12. The second output region 19 is located totally within a portion of the bulk of the semiconductor body 12. A dielectric gate layer 21 covers a vertical surface of portion 20 of semiconductor body 12 and serves as a gate dielectric layer of the transistor. A layer 25, which is conductive, covers inside surfaces of gate dielectric layer 21, insulating collar 29, and trench top oxide (TTO) layer 21a and serves as part of a gate (gate electrode) of the transistor. Layer 25 may be comprised of multiple conductive layers but typically comprises a layer of doped polysilicon. A conductive layer 38aa is in electrical contact with layer 25. A conductive layer 40b is in electrical contact with layer 38aa. Layers 40b, 38aa, and 25 form the gate electrode of each transistor. An insulating collar 22, typically of silicon oxide, partially surrounds a region 27, which is typically doped polysilicon and contacts the second output region 19. An insulating layer 29 covers a vertical portion of region 25 and extends to a top surface 28. Layer 38aa is electrically isolated from drain contact layer 56 by insulating sidewall spacer regions 36 and insulating layers 42a and 48a. As will become clear from the below description of how semiconductor structure 10 is fabricated, portions 38aa and 40b of the gate electrode are formed using a Damascene process and electrodes (drain region 18 contacts) 56 are self aligned borderless contacts.

Figure 2:
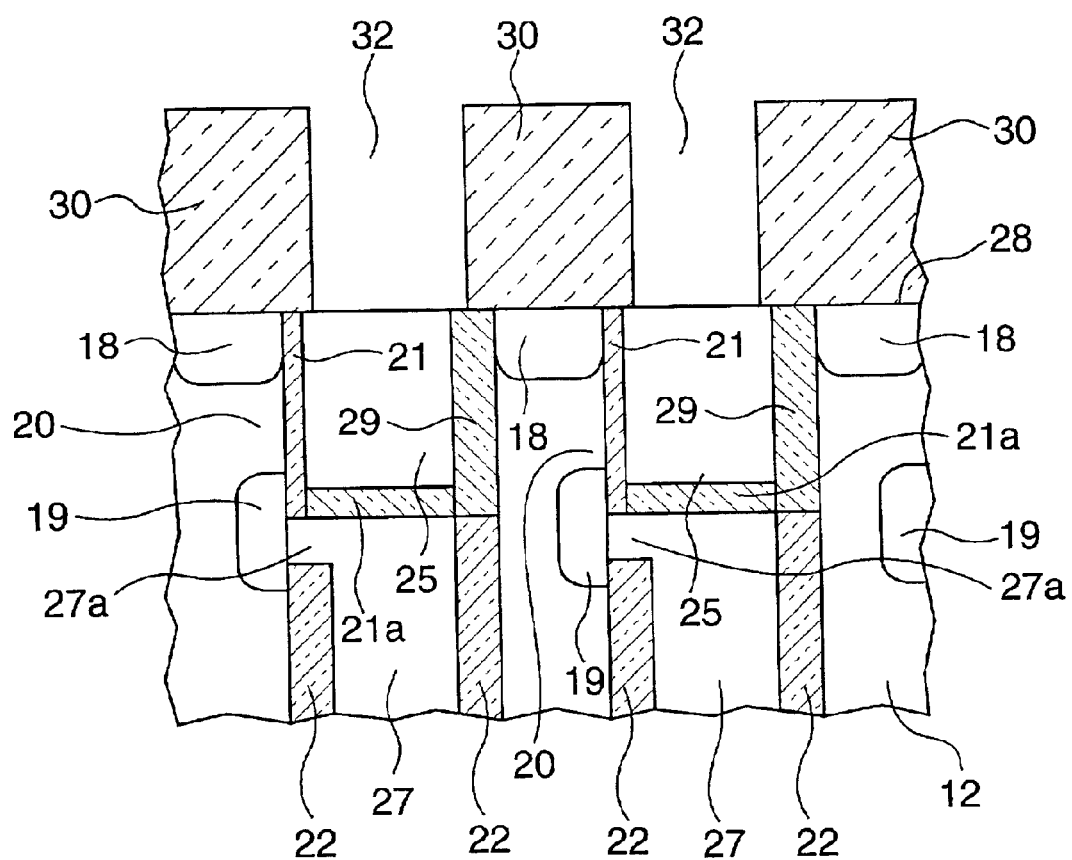
FIGS. 2–12 show the semiconductor structure of FIG. 1 at various stages of processing to form electrical contacts of the semiconductor structure of FIG. 1.

FIG. 2 shows the semiconductor structure 10 of FIG. 1 at an early stage of fabrication with the transistors and capacitors formed in semiconductor body 12 and with a first insulator layer 30, typically silicon oxide, covering the top surface 28. Layer 30 has been patterned lithographically and then etched to form openings (holes) 32 therethrough which expose portions of the top surface 28.

Figure 3:
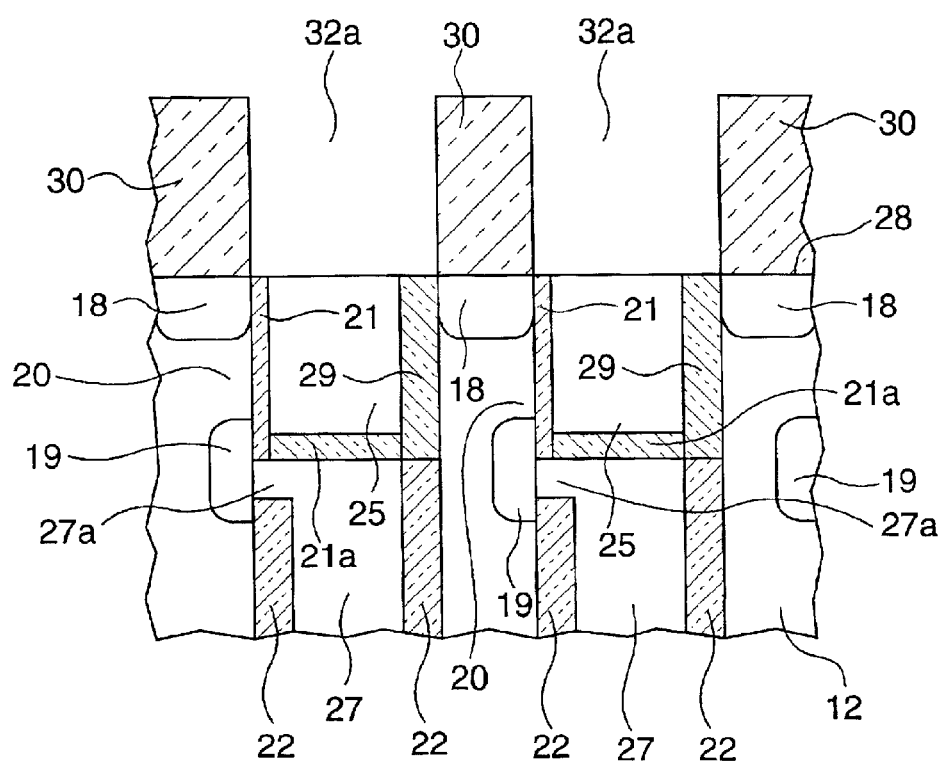

FIG. 3 shows the semiconductor structure at a next stage in fabrication process. The first insulating layer 30 is patterned lithographically and then etched to increase the size of the openings 32 which are shown in FIG. 3 as openings 32a. At the bottom of each of the openings 32a is exposed a portion of the top surface 28.

Figure 4:
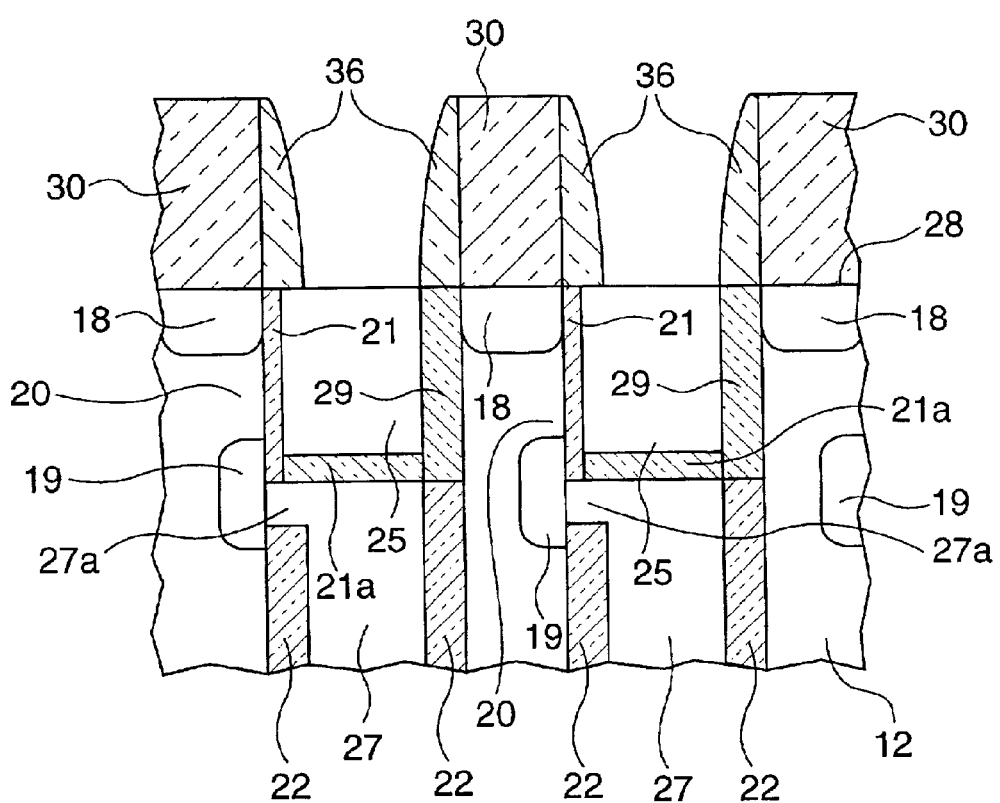

FIG. 4 shows the semiconductor structure after a layer 38 of silicon nitride is deposited by Low Pressure Chemical Vapor Deposition (LPCVD) and Reactively Ion Etched (RIE) etched to form insulating sidewall spacer regions 36 on side surfaces which define openings 32a through layer 30. The forming of the insulating sidewall spacer regions 36 early in the contact forming process facilitates formation of a void free vertical insulating layer.

Figure 5:
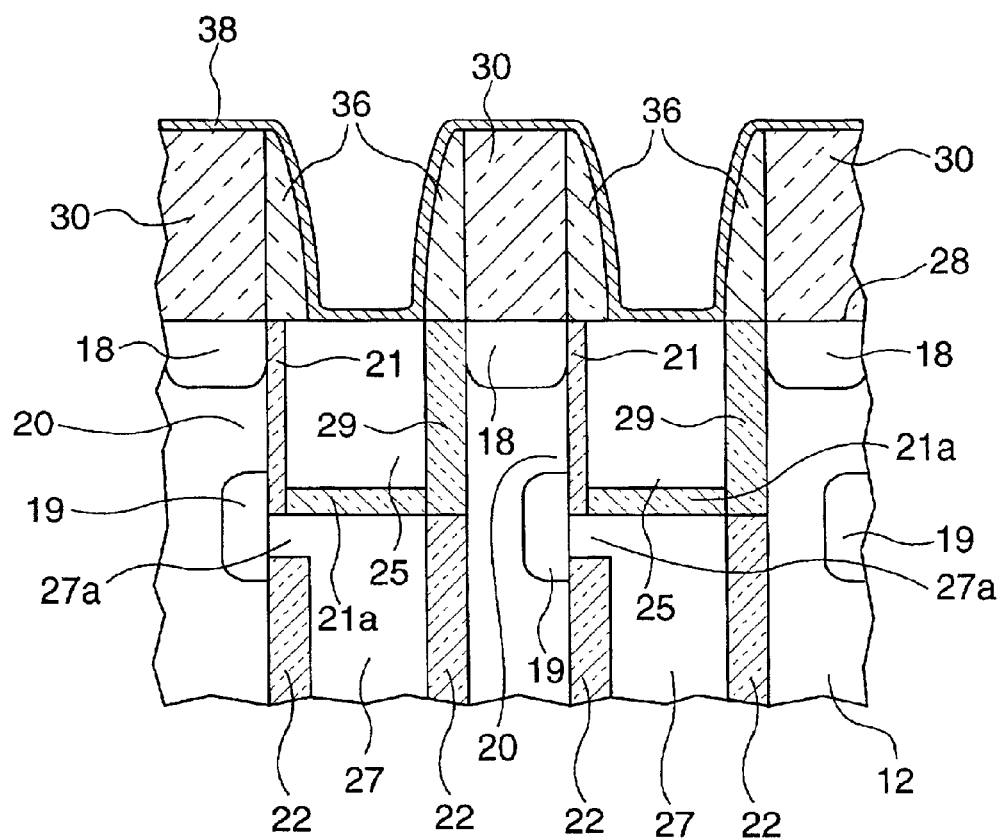

FIG. 5 shows the semiconductor structure after a liner layer 38, typically of titanium nitride (TiN), has been deposited by Physical Vapor Deposition (PVD). The layer 38 conformally coats all of the exposed surfaces of the semiconductor structure. The layer 38 is used as an adhesive layer and in some instances is optional.

Figure 6:
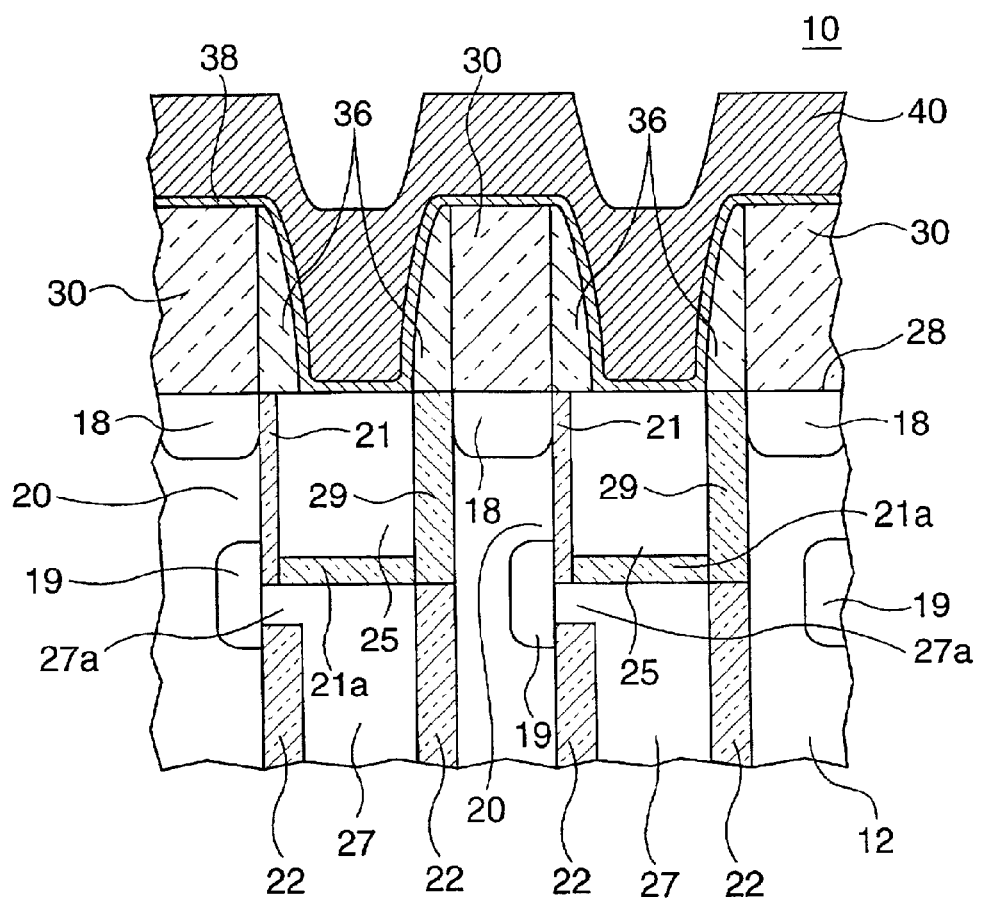

FIG. 6 shows the semiconductor structure with a layer 40, typically of PVD tungsten (W), deposited thereover. The layer 40 overfills the openings 32a and acts as a first conductor over the layer 38.

Figure 7:
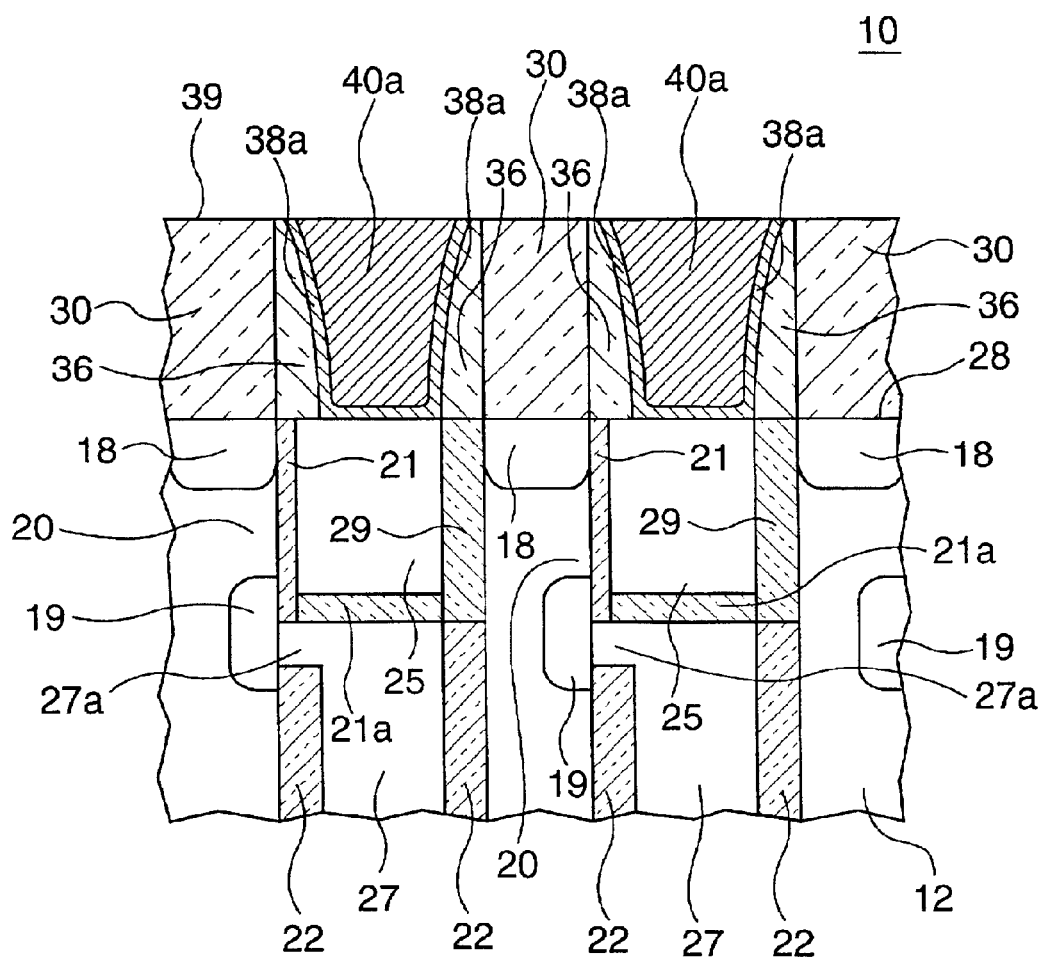

FIG. 7 shows the resulting structure after a top surface of the semiconductor structure is planarized resulting in a top surface 39 using a Chemical Mechanical Polish (CMP) to remove portions of the layer 40, insulating sidewall spacer regions 36, layer 38 and a portion of layer 30 leaving separated metal layers 40a, portions 38a of layer 38, and insulating sidewall spacer regions 36 and layer 30 somewhat reduced in vertical height. These steps shown in FIGS. 6 and 7 are typically denoted as a Damascene process.

Figure 8:
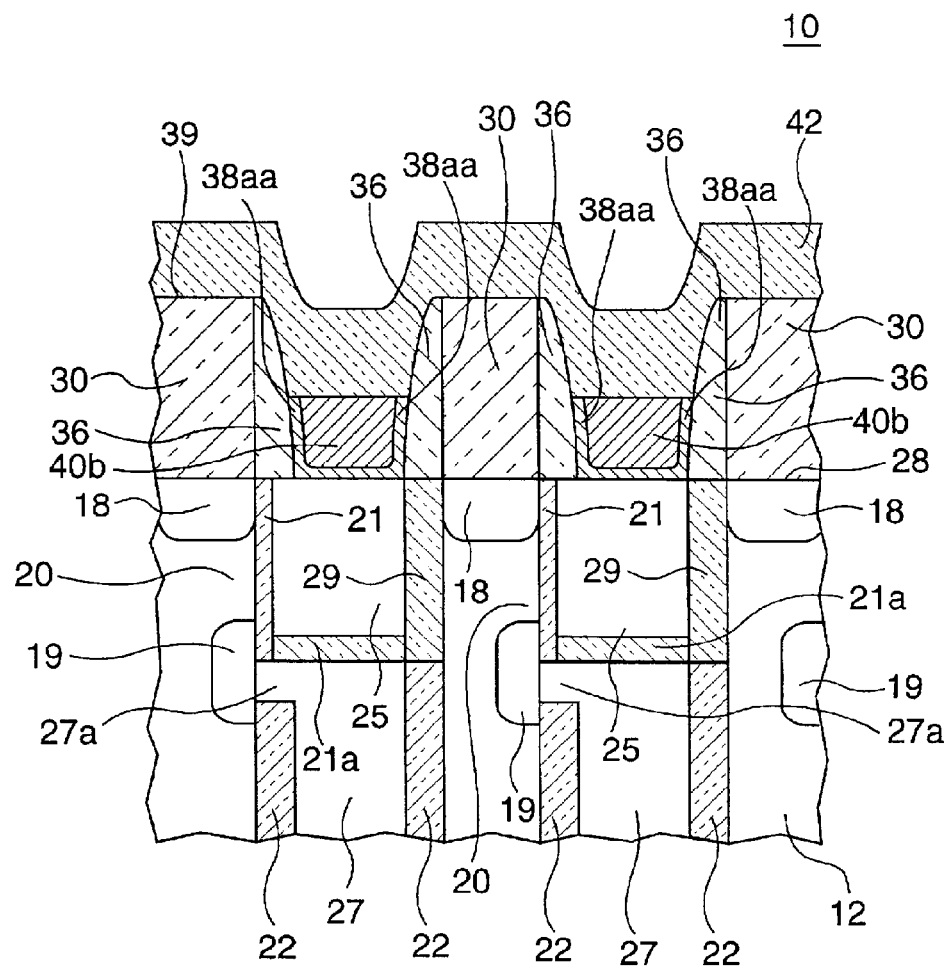

FIG. 8 shows the semiconductor structure after the layers 38a and 40a have been recessed by RIE to about half of their original thickness to become layers 38aa and 40b, respectively. A top resulting surface of the structure is then covered with a layer 42, typically of LPCVD SiN, about 200 nm thick, which conformally coats the top resulting surface.

Figure 9:
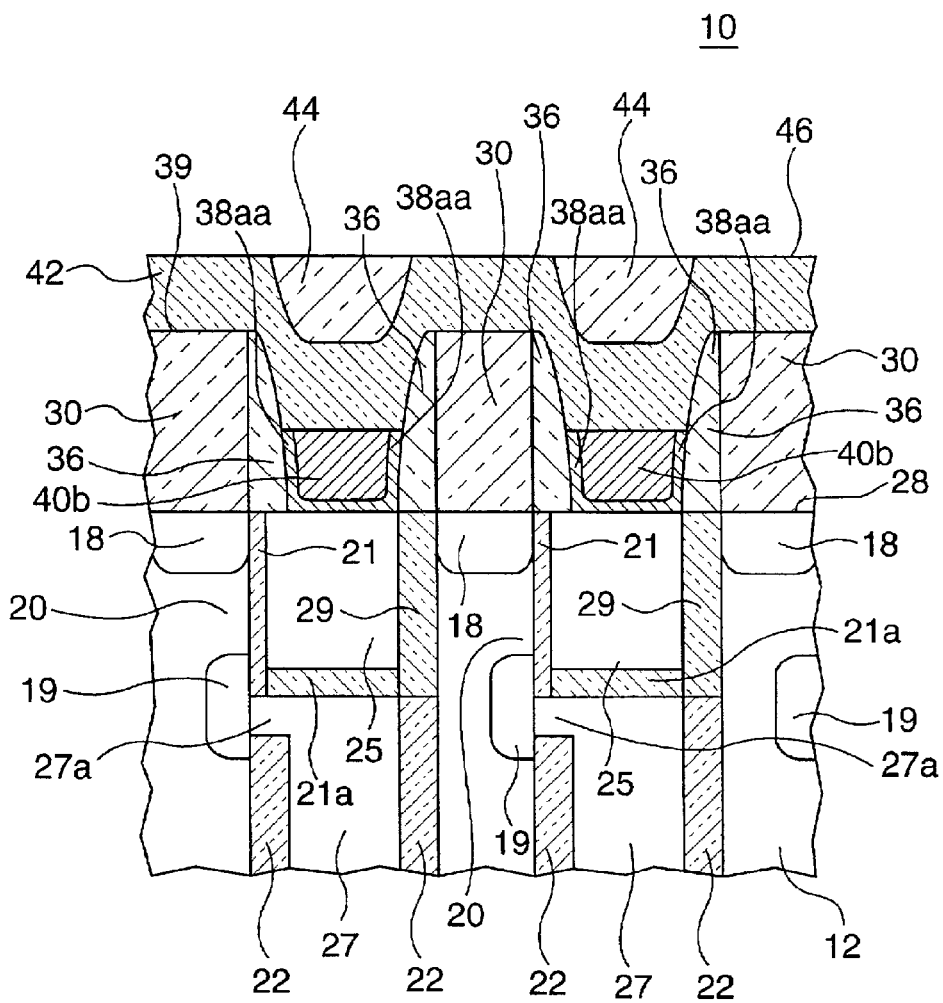

FIG. 9 shows the resulting structure after a layer 44, typically of an Anti-Reflective Coating Material (ARC), has been spun onto the surface in liquid form. The layer 44 fills in the depressions on the surface created when the layer 42 covered the recessed layer 40b. The layer 44 is subsequently treated to form a solid which results in a relatively planarized top surface 46. Alternatively, a layer of polysilicon is deposited in place of the ARC material 44, to overfill the depression. Excess polysilicon is removed from the surface 46 by CMP thereby leaving polysilicon only within the depressions. This resulting structure replicates the structure shown in FIG. 9 with the only change being the substitution of polysilicon for the ARC material 44. The structure is now ready for further processing.

Figure 10:
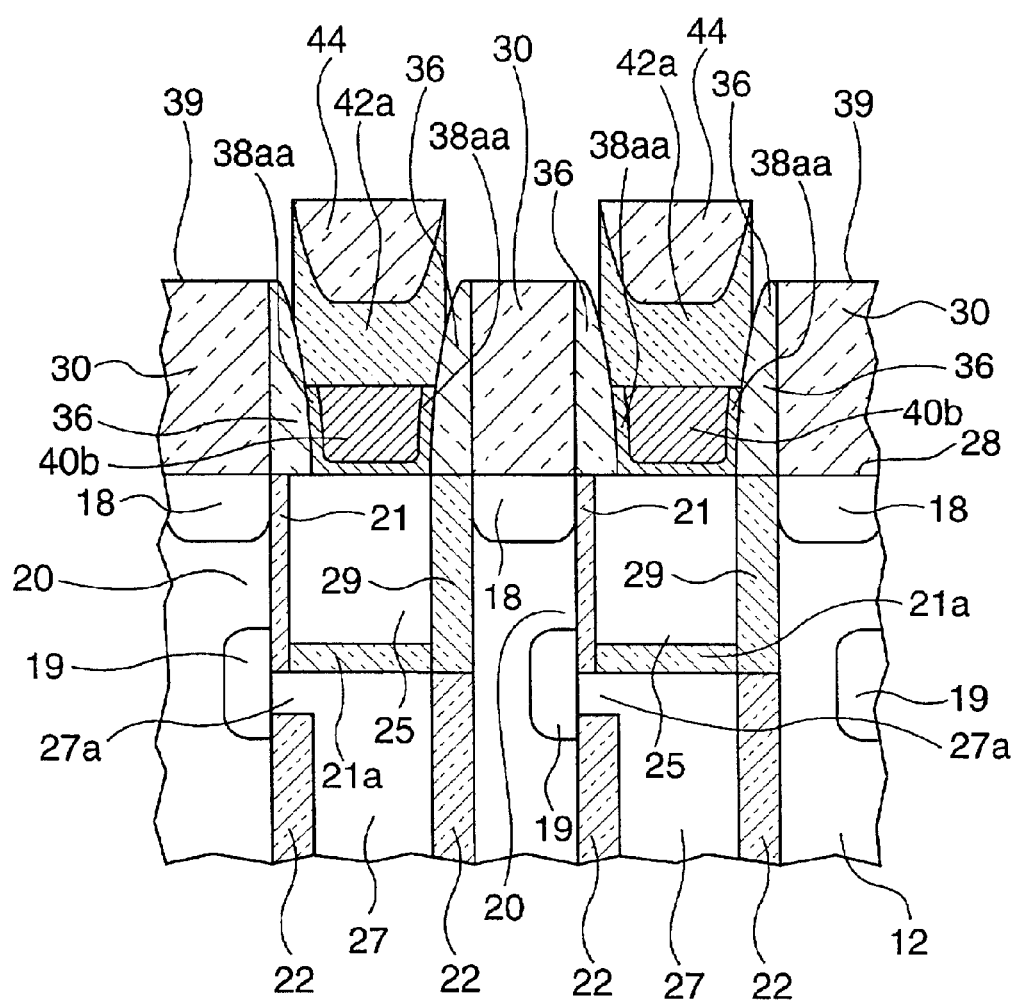

FIG. 10 shows the structure of FIG. 9 after partial removal of the layer 42 by Reactive Ion Etching (RIE) to result in a segmented layer having portions 42a. The RIE stops on the top surface 39 of oxide layer 30.

Figure 11:
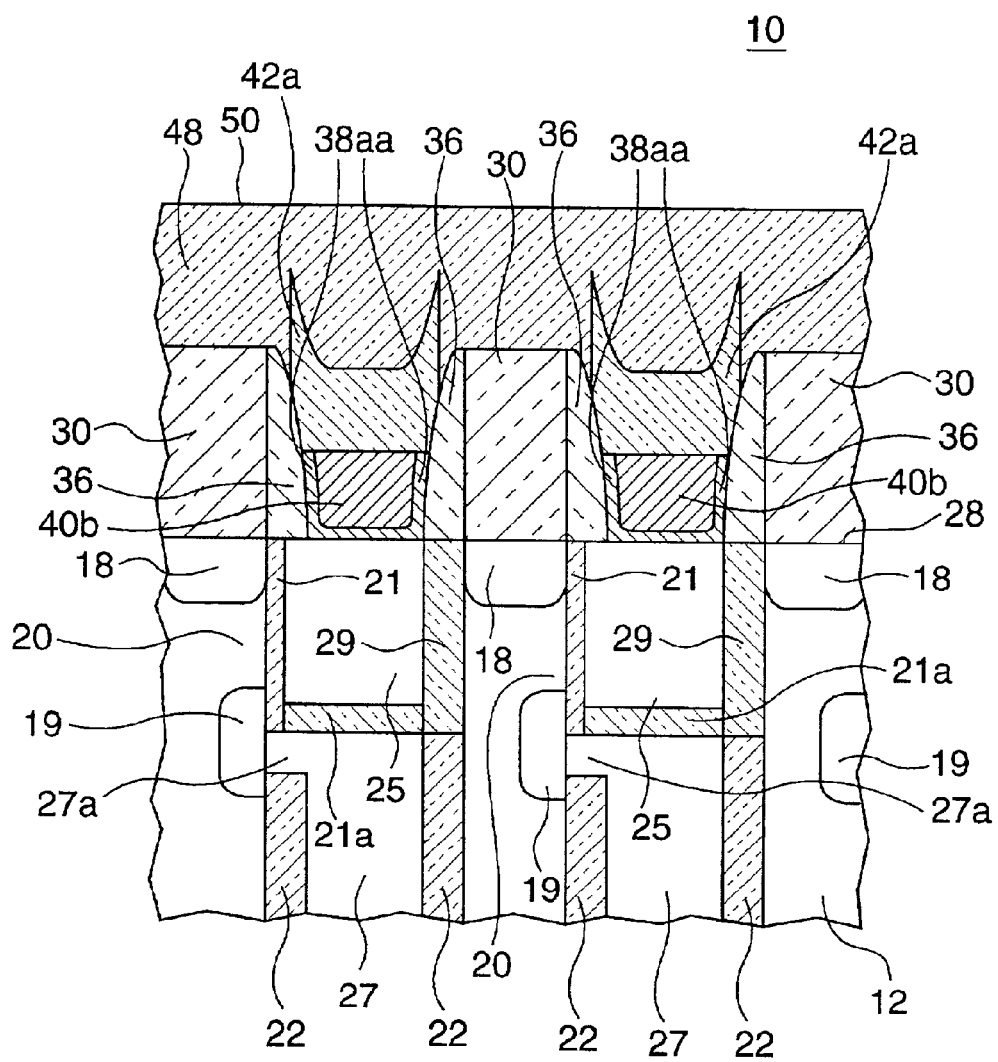

FIG. 11 shows the top surface of the semiconductor structure 10 after the ARC layer has been removed with a wet chemical etch and a layer 48, typically of LPCVD formed Boron Phosphosilicate Glass (BPSG), is deposited thereover. The resulting structure is reflowed to form a relatively planar top surface 50.

Figure 12:
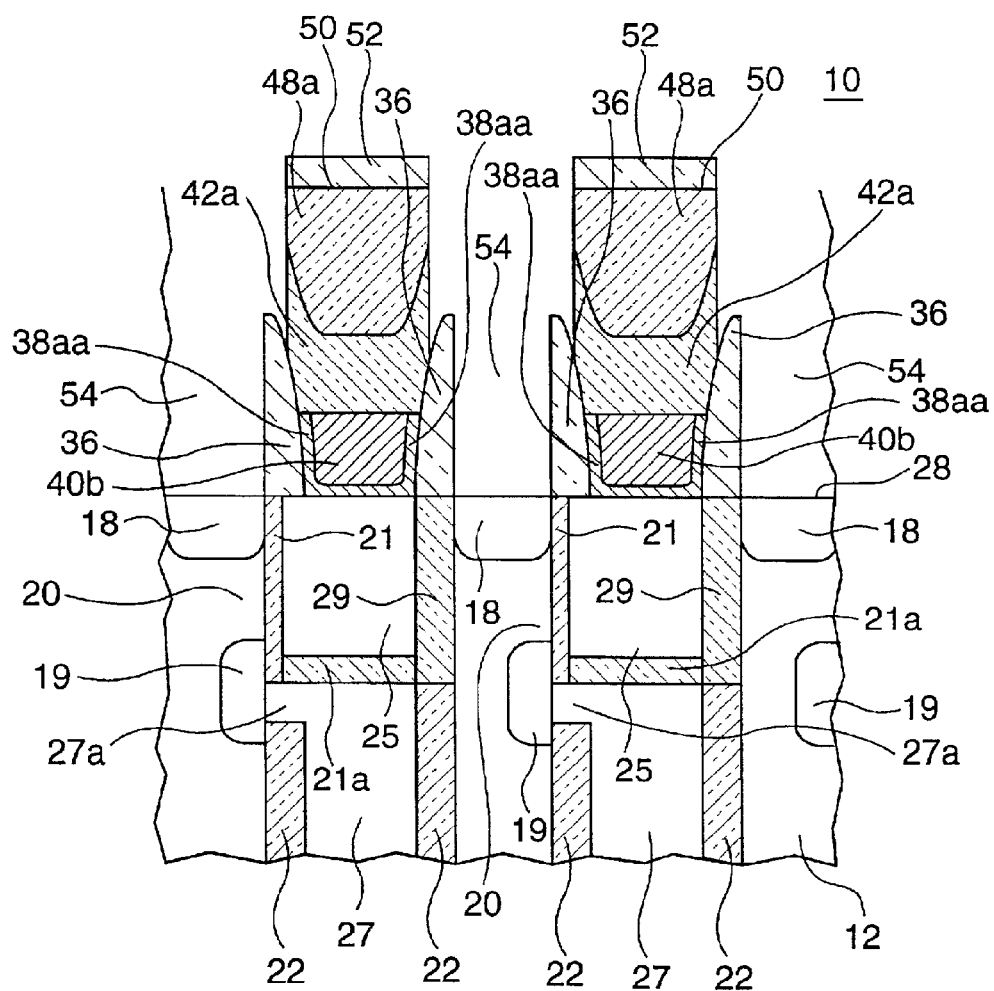

FIG. 12 shows the resulting structure after applying a patterning photoresist layer 52 and etching therethrough both the layer 48 and the layer 30 to form openings 54 so that the silicon surface 28 is exposed above each of the first output regions 18. Separated portions 48a of layer 48 remain.

FIG. 1 shows the resulting semiconductor structure 10 after the patterned photoresist layer 52 has been removed and the openings 54 have been filled with separate conductors 56 which form contact to each of the first output regions 18. The drain (first output) regions of the transistors of memory cells of a common column of memory cells are typically coupled to a common bit line (not shown). Each gate contact (electrode) 40b is part of a word line which typically contacts all gate electrodes of transistors of a given row of memory cells of the memory array. The word lines and the bit lines are typically orthogonal to each other.

Figure 13:
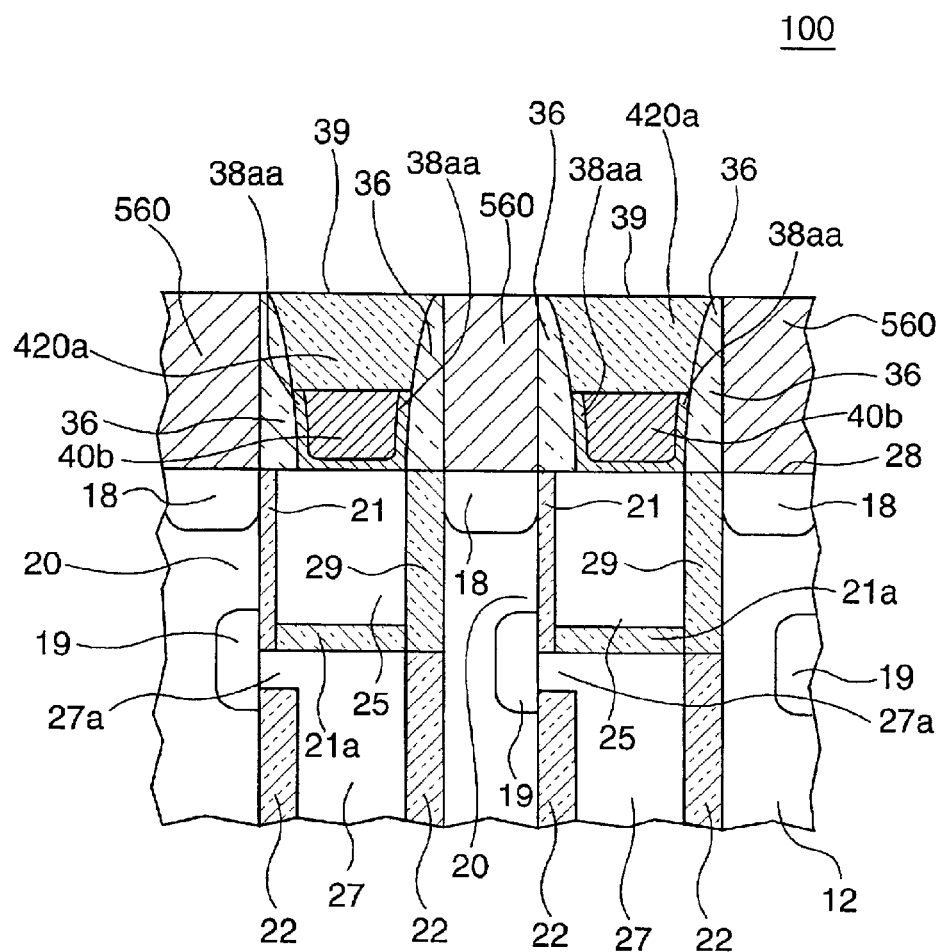
FIG. 13 shows a cross-sectional view of a second semiconductor structure in accordance with another embodiment of the present invention.
Figure 14:
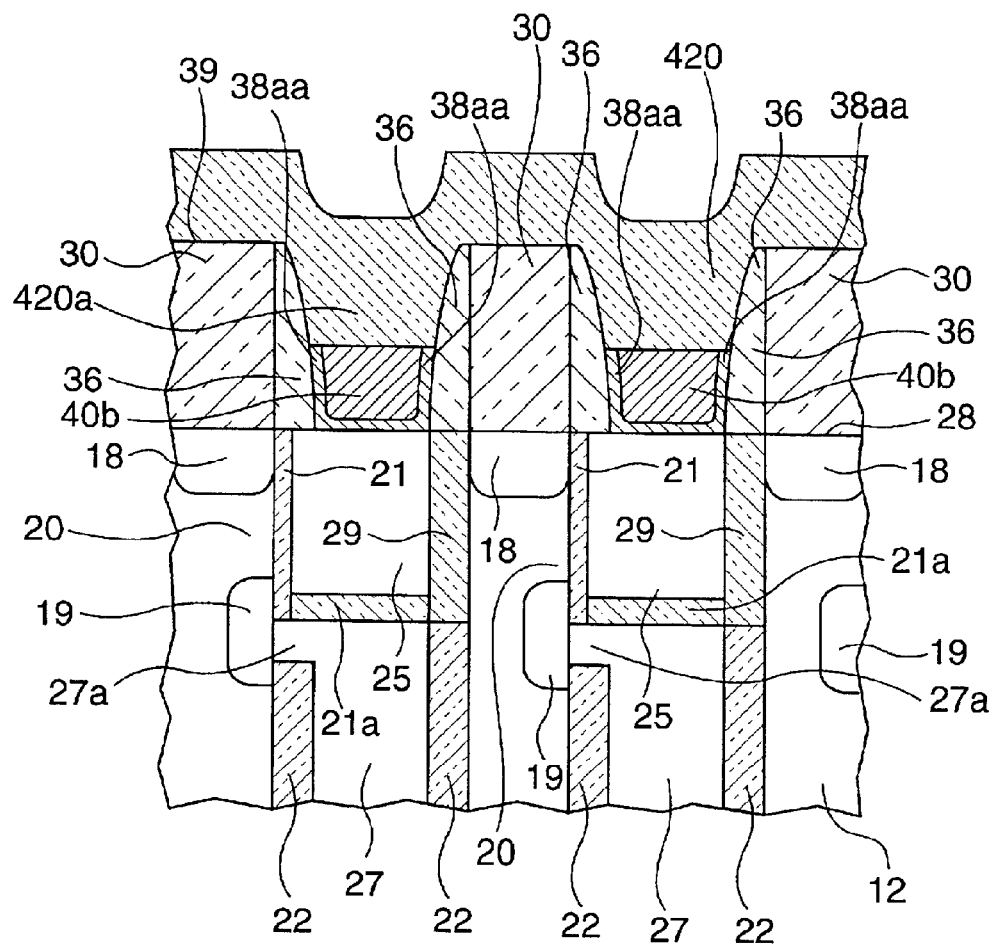
FIGS. 14, 15 and 16 show the semiconductor structure of FIG. 13 at various stages of processing to form electrical contacts of the semiconductor structure of FIG. 13.
Figure 15:
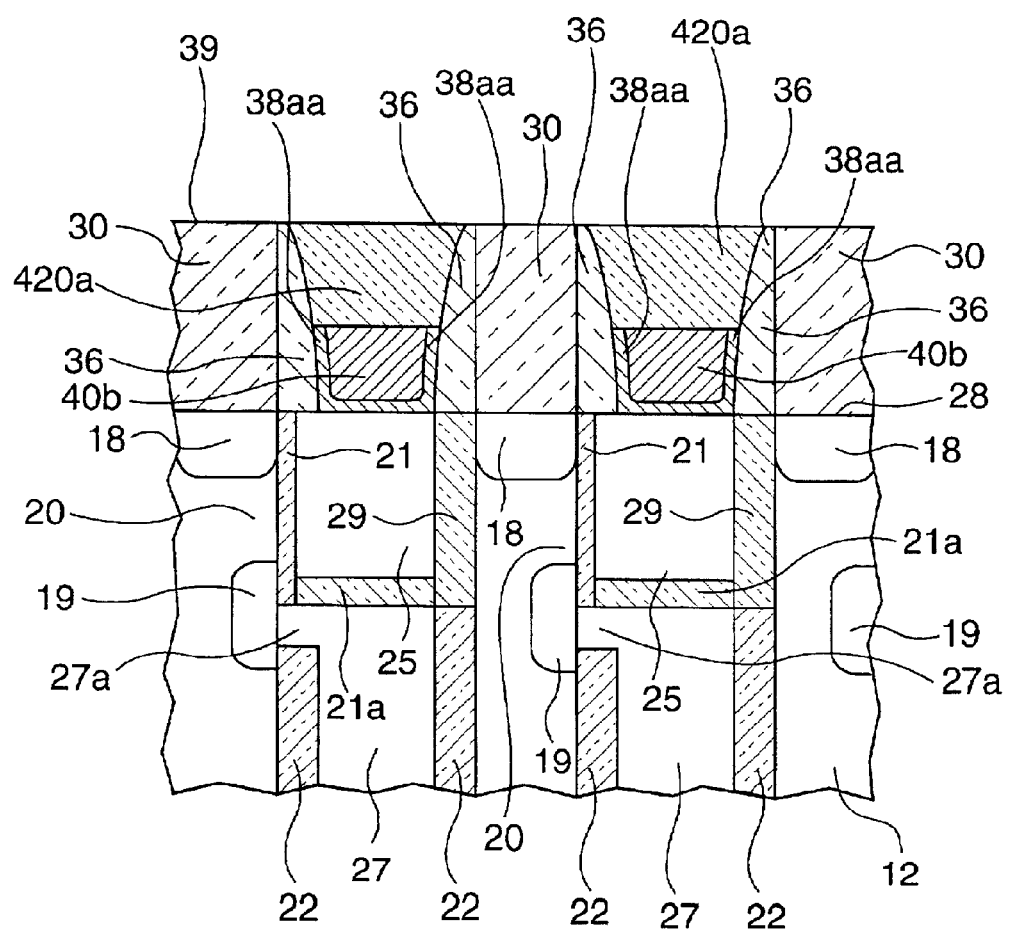

FIG. 13 shows an a cross-sectional view of a semiconductor structure 100 which comprises a plurality of memory cells of a dynamic random access memory (DRAM) formed in and on a semiconductor body (substrate) 12 in accordance with an embodiment of the present invention. Structure 100 is similar to structure 10 of FIG. 1 and identical portions thereof have the same references numbers. The structure of the memory cells of structure 100 is identical to that of the memory cells of FIG. 1. Insulating sidewall spacer regions 36, adhesive conductive layer 38aa, and conductive layer 40b of structure 100 are also essentially the same as the corresponding portions of structure 10 of FIG. 1. The main difference between structures 10 and 100 is that the height of conductors 560 to drain regions 18 is nominally less than that of conductors 56 of structure 10 of FIG. 1. Bit lines (not shown) are typically coupled to conductors 560 and conductors 40b are portions of word lines. The word lines and bit lines are orthogonal to each other and cross talk can occur between them. Since in FIG. 1 the bit lines are further removed from the word lines than they are in FIG. 13, there could be less cross talk in the structure 10 of FIG. 1 than in structure 100 of FIG. 13. An advantage of semiconductor structure 100 FIG. 13 is that it requires fewer processing steps and is a simpler structure. The initial processing steps for fabricating structure 100 are essentially the same as are shown in FIGS. 2–8 for structure 10 of FIG. 1. FIGS. 14 and 15 show the processing of structure 100 after processing shown in FIGS. 2–7 has been completed.

FIG. 14 shows that the thickness of layer 420, typically of silicon nitride and very similar to layer 42 of FIG. 8, is somewhat greater than that of layer 42 such that at its low points it is above the top surface 39 of silicon oxide layer 30.

FIG. 15 shows the process at the next stage where all of layer 420 above surface 39 has been removed leaving portions 420a of layer 420. This can be accomplished using chemical mechanical polishing (CMP) and in some instances using chemical etching.

Figure 16:
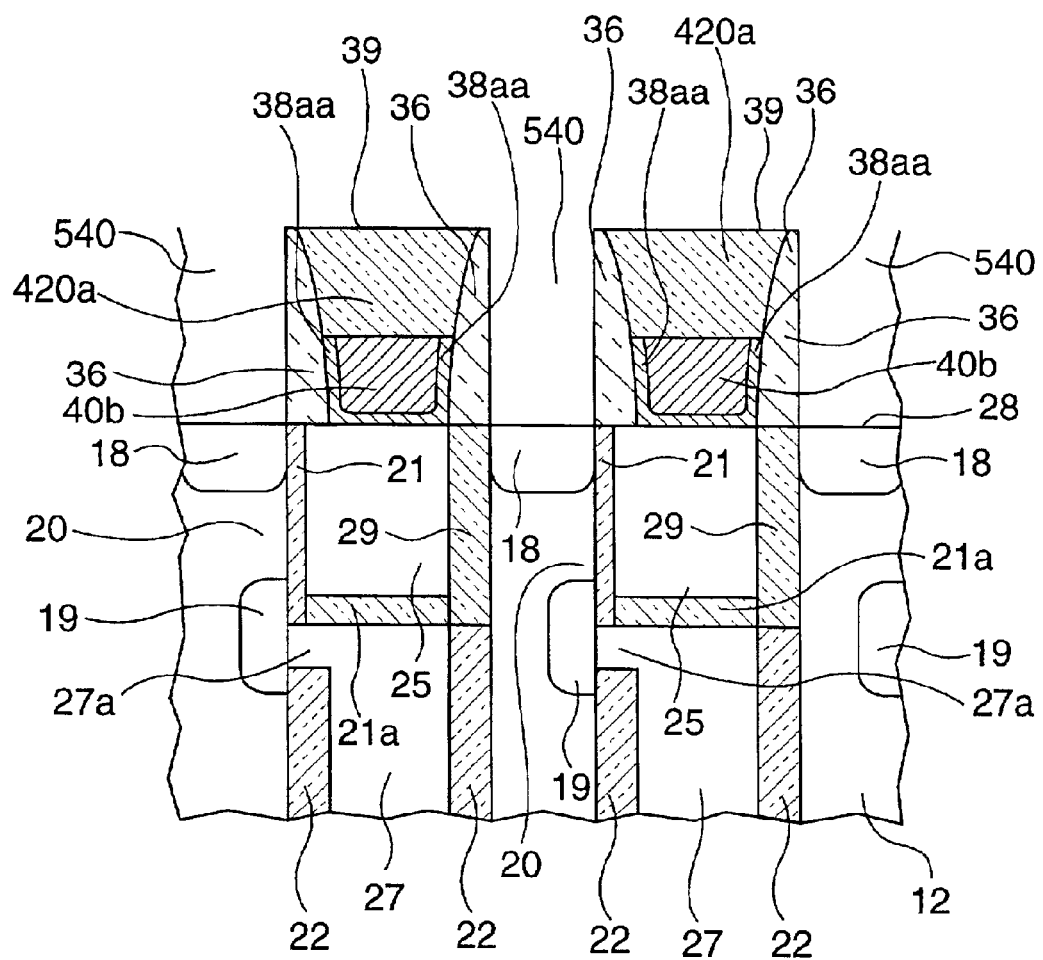

FIG. 16 shows the resulting structure after layer 30 has been etched away so that the silicon surface 28 is exposed above each of the first output regions 18. This can be achieved by using a selective etchant which removes layer 30 but does not affect layer 420a or insulating sidewall spacer regions 36 or by masking top surfaces of insulating sidewall spacer regions 36 and top surfaces of layer 420a with a patterned photoresist layer (not shown) and then etching layer 30.

FIG. 13 shows the resulting semiconductor structure 100 after the patterned photoresist layer has been removed, if one is used, and the openings 540 have been filled with separate conductors 560 which form contact to each of the first output regions 18. Typically openings 540 are over filled with a conductive layer and then chemical mechanical polishing is used to remove the portion above surface 39 to result in individual conductors 560. The drain (first output) regions of the transistors of memory cells of a common column of memory cells are typically coupled to a common bit line. The gate contacts (electrodes) 40b are part of word lines and the drain contacts 560 are coupled to bit lines (not shown).

It is to be noted that the specific embodiments that have been described are illustrative of the general principles of the invention. Various other embodiments can be devised without departing from the spirit and scope of the invention. For example, the W layer can be replaced with consecutive layers of doped polysilicon/tungsten silicide. It is to be noted that the TiN layer is not needed when using these materials. Also, other designs for vertical transistors can be used with the methods described.

What is claimed is:

1. A method of forming in a semiconductor body of a first conductivity type in which there has been formed an array of memory cells which each comprise an insulated gate field effect transistor, which comprises first and second output regions of a second opposite conductivity type and a gate which is separated from the semiconductor body by a gate dielectric layer, contacts to the gates and the first output regions, the method comprising the steps of:

forming first insulating regions around portions of a top surface of the semiconductor body in which gate contacts are to be formed;

forming gate contacts using a Damascene process in the portions of the semiconductor body surrounded by the first insulating regions;

forming second insulating regions around exposed portions of the gate contacts;

forming a borderless contact to each one of the first output regions of each transistor with the first and second insulating regions electrically isolating the gate contacts from the contacts to the first output regions.

2. The method of claim 1 wherein the borderless contacts to the first output regions are formed using a Damascene process.

3. A method of forming in a semiconductor body, which has a top surface and being of a first conductivity type, and in which there has been formed an array of memory cells which each comprise a vertical insulated gate field effect transistor having first and second output regions of a second opposite conductivity type and a gate which is separated from a vertical surface of the semiconductor body by a gate dielectric layer, contacts to the gates and the first output regions, the method comprising the steps of:

forming vertical insulating regions around portions of the top surface of the semiconductor body in which gate contacts are to be formed;

forming gate contacts using a Damascene process in the portions of the semiconductor body surrounded by the first insulating regions;

forming horizontal insulating regions around exposed portions of the gate contacts;

forming a borderless contact to each one of the first output regions of each transistor with the vertical and horizontal insulating regions electrically isolating the gate contacts from the contacts to the first output regions.

4. The method of claim 3 wherein the borderless contacts to the first output regions are formed using a Damascene process.

5. A method of forming in a semiconductor body, which has a top surface and is of a first conductivity type, and in which there have been formed an array of memory cells which each comprise a trench capacitor and a vertical insulated gate field effect transistor, which comprises first and second output regions of a second opposite conductivity type and a gate which is separated from a vertical surface of the semiconductor body by a gate dielectric layer, electrical contacts to the gates and first output regions, the method comprising the steps of:

forming a first insulating layer over a top surface of the semiconductor body;

forming first openings through the first insulating layer so as to expose a portion of the top surface of the semiconductor body in which the gates are located;

forming insulating sidewall spacer regions on sidewalls of the openings through the first insulating layer with the insulating sidewall spacer regions being of a different material than the first insulating layer;

over filling the first openings through the first insulating layer with a first conductor which contacts the gates of each transistor and extends over a top surface of the first insulating layer;

removing portions of the first conductor on the top surface of the first insulating layer so as to result in a segmented first conductor filling each of the first openings;

covering exposed surfaces of the first conductors with a second insulating layer which is of a material different than that of the first insulating layer;

forming first openings through the second insulating layer and second openings through the first insulating layer between adjacent insulating sidewall spacer regions to expose portions of the semiconductor top surface which include portions of the first output regions; and filling each of the second openings through the first insulating layer with a second conductor which contacts a first output region such that each second conductor is self aligned and borderless.

6. A method of forming in a semiconductor body of a first conductivity type in which there have been formed an array of memory cells which each comprise a trench capacitor and a vertical insulated gate field effect transistor, which comprises first and second output regions of a second opposite conductivity type and a gate which is separated from a surface of the semiconductor body by a gate dielectric layer, electrical contacts to the gate and first output region, the method comprising the steps of:

forming a first insulating layer over a top surface of the semiconductor body;

forming separated first openings through the first insulating layer so as to expose a portion of the top surface of the semiconductor body in which the gates are located;

forming insulating sidewall spacer regions on sidewalls of the openings through the first insulating layer with the insulating sidewall spacer regions being of a different material than the first insulating layer;

over filling the first openings through the first insulating layer with a first conductor which contacts the gates of each transistor and extends over a top surface of the first insulating layer;

removing portions of the first conductor on the top surface of the first insulating layer so as to result in a segmented first conductor filling each of the first openings;

removing portions of the segmented first conductors so as to recess same in each of the first openings;

over filling the first openings with a second insulating layer which is of a material different than that of the first insulating layer;

removing portions of the second insulating layer so as to form a planar surface which includes portions of the first and second insulating layers;

forming second openings through the first insulating layer between adjacent insulating sidewall spacer regions to expose portions of the semiconductor top surface which include portions of the first output regions; and filling each of the second openings through the first insulating layer with a second conductor which contacts a first output region such that each second conductor is self aligned and borderless.

7. The method of claim 6 wherein:

each of the second openings is over filled with a second conductor; and removing portions of the second conductor which overfills the second openings so as to form separated second conductors which each contact a first output region.

8. The method of claim 7 wherein the removing of portions of the first and second conductors is done using chemical mechanical polishing.

9. The method of claim 7 wherein the removing of portions of the first and second conductors is done chemical etching.

10. The method of claim 6 wherein the first insulating layer is silicon oxide and the second insulating layer is silicon nitride.

11. The method of claim 7 wherein the removing of portions of the first and second conductors is done using chemical mechanical polishing.

12. The method of claim 7 wherein the removing of portions of the first and second conductors is done chemical etching.

13. The method of claim 6 wherein the first insulating layer is silicon oxide and the second insulating layer is silicon nitride.

14. A method of forming in a semiconductor body of a first conductivity type in which there have been formed an array of memory cells which each comprise a trench capacitor and a vertical insulated gate field effect transistor, which comprises first and second output regions of a second opposite conductivity type and a gate which is separated from a surface of the semiconductor body by a gate dielectric layer, electrical contacts to the gate and first output region, the method comprising the steps of:

forming a first insulating layer over a top surface of the semiconductor body;

forming separated first openings through the first insulating layer so as to expose a portion of the top surface of the semiconductor body in which the gates are located;

forming insulating sidewall spacer regions on sidewalls of the openings through the first insulating layer with the insulating sidewall spacer regions being of a different material than the first insulating layer;

over filling the first openings through the first insulating layer with a first conductor which contacts the gates of each transistor and extends over a top surface of the first insulating layer;

removing portions of the first conductor on the top surface of the first insulating layer so as to result in a segmented first conductor filling each of the first openings;

removing portions of the segmented first conductors so as to recess same in each of the first openings;

over filling the first openings with a second conformal insulating layer which is of a material different than that of the first insulating layer;

filling recesses in the second conformal insulating layer with a self planarizing third insulator layer so as to form a planar surface common to the second conformal insulating layer and the self planarizing insulator layer, the self planarizing insulator layer being of a different material than the first insulating layer;

removing portions of the second conformal insulating layer not covered by the self planarizing third insulating layer;

removing the self planarizing third insulator layer;

forming a fourth insulating layer over the resulting structure;

removing all portions of the fourth insulating layer except those portions which are over the remaining portions of the second insulating layer and remaining portions of the first insulator layer to create separated first openings through the fourth insulator layer and second openings through the first insulator layer to expose portions of the top surface of the semiconductor body in which are located the first output regions, the first openings through the fourth insulating layer and the second openings through the first insulating layer being aligned;

filling each of the first openings through the fourth insulating layer and the second openings through the first insulating layer with a second conductor which contacts a first output region such that each second conductor is self aligned and borderless.

15. The method of claim 14 wherein:

each of the first openings in the fourth insulating layer is overfilled with the second conductor; and removing portions of the second conductor which overfills the first openings in the fourth insulating layer so as to form separated second conductors which each contact a first output region.

16. The method of claim 14 wherein the removing of portions of the first and second conductors is done using chemical mechanical polishing.

17. The method of claim 14 wherein the removing of portions of the first and second conductors is done chemical etching.

18. The method of claim 14 wherein the first insulating layer is silicon oxide, the second insulating layer is silicon nitride, the self planarizing third insulator layer is chosen from a group consisting of an anti-reflective material and polysilicon, and the fourth insulating layer is boron phosphosilicate glass.

* * * * *